United States Patent [19]
Evans, Jr. et al.

[11] Patent Number: 6,117,688
[45] Date of Patent: Sep. 12, 2000

[54] METHOD FOR CONSTRUCTING FERROELECTRIC BASED CAPACITOR FOR USE IN MEMORY SYSTEMS

[75] Inventors: Joseph T. Evans, Jr.; Richard Womack, both of Albuquerque, N. Mex.

[73] Assignee: Radiant Technologies, Inc., Albuquerque, N. Mex.

[21] Appl. No.: 09/075,011

[22] Filed: May 8, 1998

Related U.S. Application Data

[62] Division of application No. 08/633,853, Apr. 16, 1996, Pat. No. 5,804,850, which is a division of application No. 08/406,376, Mar. 17, 1995, Pat. No. 5,541,807.

[51] Int. Cl.⁷ .......................... H01L 21/8242; H01G 7/06
[52] U.S. Cl. ................................... 438/3; 438/240
[58] Field of Search ........................... 438/3, 240

[56] References Cited

U.S. PATENT DOCUMENTS

| | | | |
|---|---|---|---|
| 5,541,807 | 7/1996 | Evans, Jr. et al. | 257/295 |
| 5,578,846 | 11/1996 | Evans, Jr. et al. | 257/295 |
| 5,798,903 | 8/1998 | Dhote et al. | 257/295 |
| 5,838,035 | 11/1998 | Ramesh | 257/295 |
| 5,977,577 | 11/1999 | Evans, Jr. | 257/295 |

*Primary Examiner*—Jey Tsai
*Attorney, Agent, or Firm*—Calvin B. Ward

[57] ABSTRACT

A ferroelectric based capacitor structure and method for making the same. The capacitor includes a bottom electrode having a layer of Pt in contact with a first layer of an ohmic material. The capacitor dielectric is constructed from a layer of lead zirconium titanate doped with an element having an oxidation state greater than +4. The top electrode of the capacitor is constructed from a second layer of ohmic material in contact with a layer of Pt. The preferred ohmic material is LSCO; although $RuO_2$ may also be utilized. The capacitor is preferably constructed over the drain of a FET such that the bottom electrode of the capacitor is connected to the drain of the FET. The resulting capacitor structure has both low imprint and low fatigue.

3 Claims, 4 Drawing Sheets

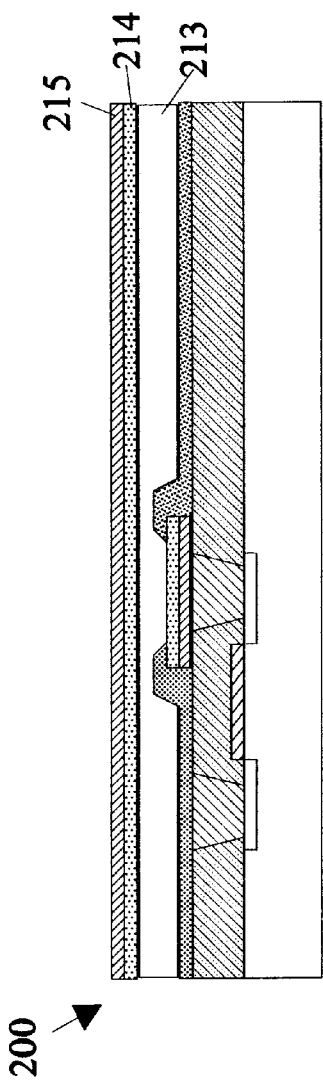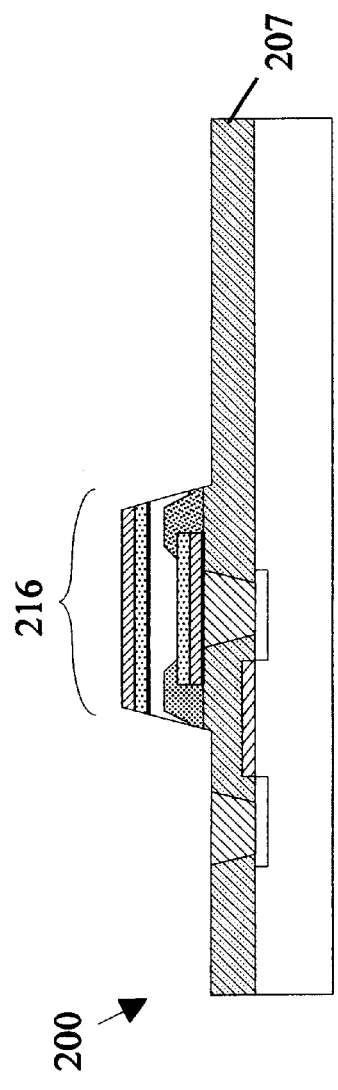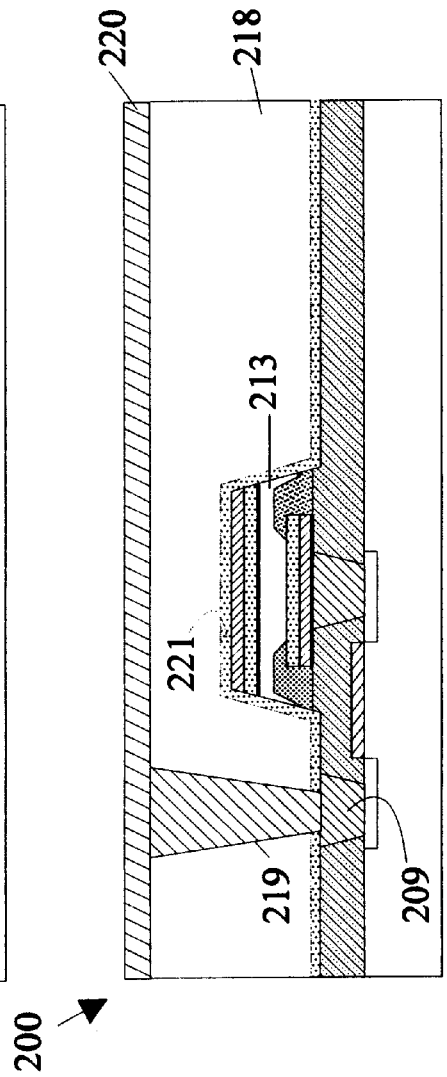

METHOD FOR CONSTRUCTING FERROELECTRIC BASED CAPACITOR FOR USE IN MEMORY SYSTEMS

This a divisional of application Ser. No. 08/633,853 filed on Apr. 16, 1996 U.S. Pat. No. 5,804,850 which was a divisional of application Ser. No. 08/406,376 filed Mar. 17, 1995, which has issued as U.S. Pat. No. 5,541,807.

FIELD OF THE INVENTION

The present invention relates to ferroelectric based capacitors, and more particularly, to an improved ferroelectric capacitor for use in memory systems.

BACKGROUND OF THE INVENTION

Computer memories may be conveniently classified in terms of whether or not the memory retains the information stored therein when power is removed from the memory. Conventional DRAMs and SRAMs are examples of memories that lose their contents when power is removed. EEPROM and flash RAM are examples of non-volatile memories. The cost of non-volatile memories per bit remains sufficiently high to discourage their use in many applications. In addition, the underlying memory structures may only be written a relatively small number of times compared to volatile memories. For example, an EEPROM memory cell can only be written approximately $10^4$ times. In addition, the time required to write data into an EEPROM is much longer than that required to write volatile memories. Hence, EEPROM cells have a relatively limited class of applications.

One class of non-volatile memory that holds the potential for providing increased write cycles and faster writes is based on ferroelectric capacitors. These capacitors have a ferroelectric dielectric which may be polarized in one of two directions. The direction of polarization is used to store information, a "1" corresponding to one direction of polarization and a "0" corresponding to the other direction of polarization. The polarization of the dielectric is maintained when power is removed from the system, thus providing non-volatile operation.

The direction of the polarization may be sensed by applying a potential sufficient to switch the polarization across the capacitor. For the purposes of this discussion, assume that the applied potential difference is such that it would switch the dielectric to the polarization state corresponding to a "1". If the capacitor was polarized such that it stored a "1" prior to the application of the read potential, the polarization will not be altered by the read voltage. However, if the capacitor was polarized such that it stored a "0" prior to the application of the read potential, the polarization direction will switch. This switching will give rise to a current that flows from one plate of the capacitor to the other. A sense amplifier measures the current that flows in response to the read potential to determine the state of the capacitor. Once the capacitor has been read, the data must be rewritten in the capacitor if the read potential caused he state of the capacitor to switch.

A ferroelectric capacitor is normally constructed by depositing a layer of the ferroelectric material on a bottom electrode and then depositing a top electrode on the ferroelectric layer. Ferroelectric layers based on PZT are well known to those skilled in the art. These materials are heated to relatively high temperatures after deposition to provide a perovskite structure having the desired ferroelectric properties. After the annealing process, the dielectric film consists of a large number of domains. Each individual domain has a spontaneous polarization equivalent to that of a mono-domain single crystal of the perovskite material. At the end of the deposition process, domains are randomly oriented.

While this type of memory has been known to the art for some time, commercial realizations of this type of memory have been limited because of two problems, commonly referred to as "imprint" and "fatigue". Imprint is the tendency of a ferroelectric capacitor to exhibit a shift of its hysteresis curve along the voltage axis in either the positive or negative direction depending on the data stored therein. This tendency can lead to a logic state failure for either of two reasons. First, after a sufficient shift, both logic states appear the same to a sense amplifier. Second, the coercive voltage becomes too large to be switched by the available programming voltage. When either case is encountered, a memory cell based on the capacitor becomes useless.

Fatigue is decrease in the magnitude of the remanent polarization of the dielectric layer with the number of times the direction of polarization is changed. Since the amount of charge displaced when the capacitor is switched is related to the remanent polarization, the capacitor finally reaches a point at which there is insufficient charge displaced to detect. At this point, a memory cell based on the capacitor also becomes useless.

Broadly, it is the object of the present invention to provide an improved ferroelectric capacitor for use in memory devices and the like.

It is a further object of the present invention to provide a ferroelectric capacitor that exhibits reduced imprint compared to prior art ferroelectric capacitors.

It is yet another object of the present invention to provide a ferroelectric capacitor that exhibits less fatigue than prior art ferroelectric capacitors.

These and other objects of the present invention will become apparent to those skilled in the art from the following detailed description of the invention and the accompanying drawings.

SUMMARY OF THE INVENTION

The present invention is a ferroelectric based capacitor structure and method for making the same. The capacitor includes a bottom electrode having a layer of Pt in contact with a first layer of an ohmic material. The capacitor dielectric is constructed from a layer of lead zirconium titanate doped with an element having an oxidation state greater than +4. The top electrode of the capacitor is constructed from a second layer of ohmic material in contact with a layer of Pt. The preferred ohmic material is LSCO; although $RuO_2$ may also be utilized. The capacitor is preferably constructed over the drain of an FET such that the bottom electrode of the capacitor is connected to the drain of the FET.

BRIEF DESCRIPTION OF THE DRAWINGS

FIGS. 2–7 are cross-sectional views of a memory cell according to the present invention at various stages in the fabrication process.

DETAILED DESCRIPTION OF THE INVENTION

Figure 1:
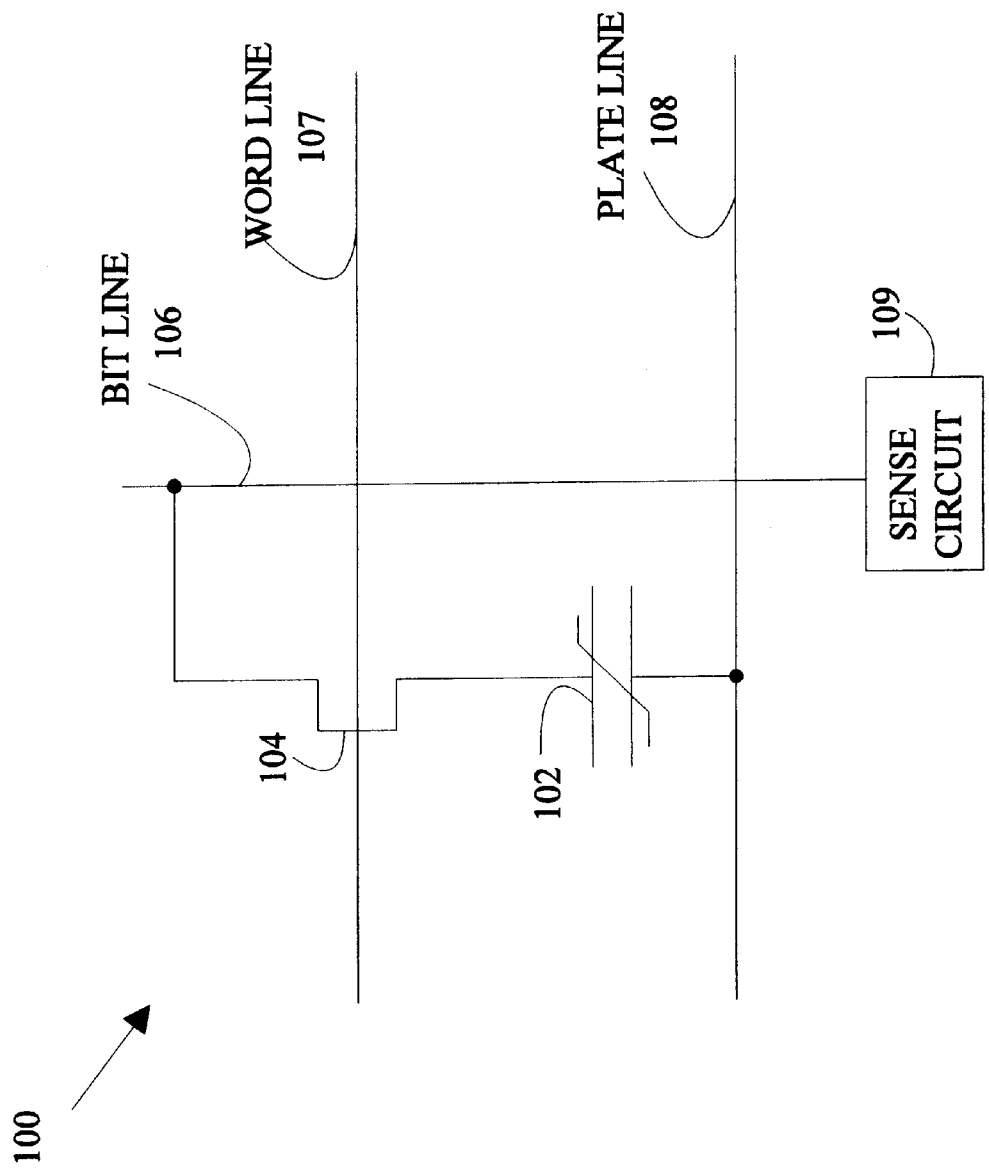
FIG. 1 is a schematic drawing of a memory cell utilizing a ferroelectric capacitor.

A destructively read ferroelectric memory cell consists of a ferroelectric capacitor 102 combined with an n-channel transistor 104 as shown in FIG. 1 at 100. The ferroelectric material of the capacitor has an electrically reversible remanent polarization. When reversed, a large compensating electrical charge must flow between the two plates of the capacitor. Transistor 104 acts as a switch that connects capacitor 102 to the bit line 106 in response to a signal on word line 107. A sensing circuit 109 measures the flow of charge into capacitor 102.

To execute a write, the word line is activated to turn on transistor 104, bit line 106 is set high or low, and then the plate line 108 is pulsed. The direction of polarization of the capacitor is set by the state of bit line 106.

To execute a read, transistor 104 is turned on, and plate line 108 is pulsed. The charge on the capacitor is forced onto bit line 106 where it is measured by sense circuit 109. If the capacitor polarization is switched by the read pulse, a current will flow on bit line 106. If, on the other hand, the polarization of capacitor 102 is already oriented in the direction provided by the read pulse, only a small current will flow on bit line 106. In either case, the polarization will be pointing in the direction specified by the read pulse after the read operation, independent of the original direction of polarization of capacitor 102. If the data was destroyed by the read operation, sense circuit 109 re-writes the correct data after the read operation.

Figure 2:
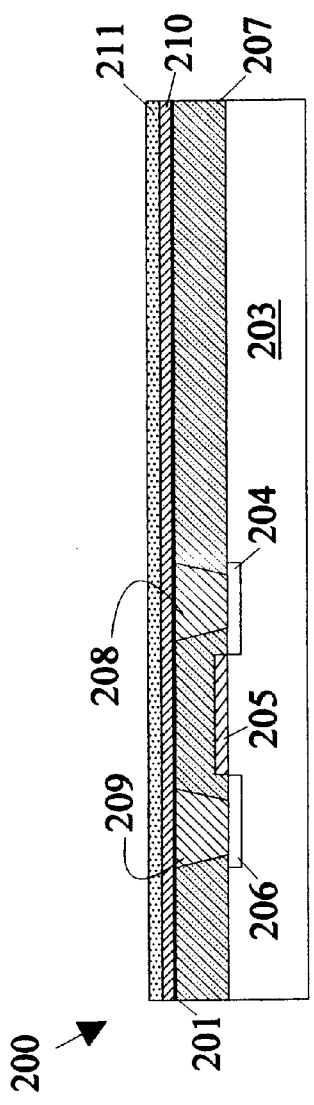

The manner in which the ferroelectric capacitor is constructed will now be discussed in more detail with respect to FIGS. 2–7 which are cross-sectional views of a memory cell 200 at various stages in the fabrication process. Refer now to FIG. 2. It is assumed that the isolation transistor has already been fabricated on the silicon substrate 203. The drain, gate, and source of the transistor are shown at 204, 205, and 206, respectively. Transistor has been covered by a layer of $SiO_2$ 207 through which vias have been etched. Contacts 208 and 209 are grown, preferably from polysilicon, in these vias. A platinum layer 210 of approximately 1500 Å is deposited on top of the $SiO_2$ layer 207 and makes electrical contact with contact 208. An approximately 600 Å layer of an ohmic material 211 is then deposited on platinum layer 210. The preferred ohmic contact material is LSCO (lanthanum strontium cobalt oxide). In the preferred embodiment of the present invention, a thin layer 201 of titanium or titantium nitride is deposited on the $SiO_2$ layer before depositing the platinum layer. This layer acts as a "glue" for bonding the platinum to the polysilicon and $SiO_2$. In addition, the glue layer prevents the polysilicon and platinum layers from interacting. The glue layer is typically 200 Å.

Figure 3:
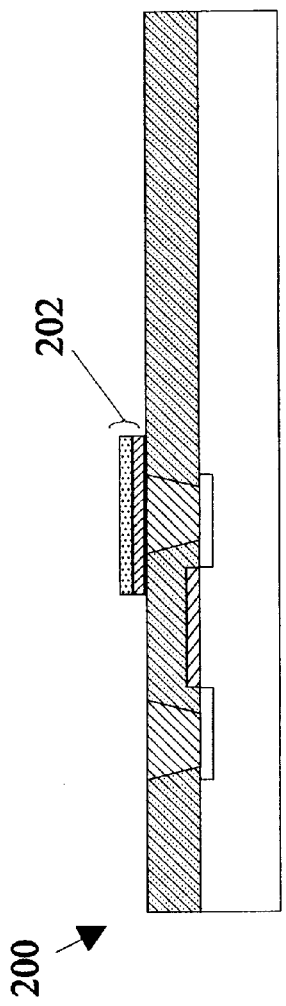
Figure 4:
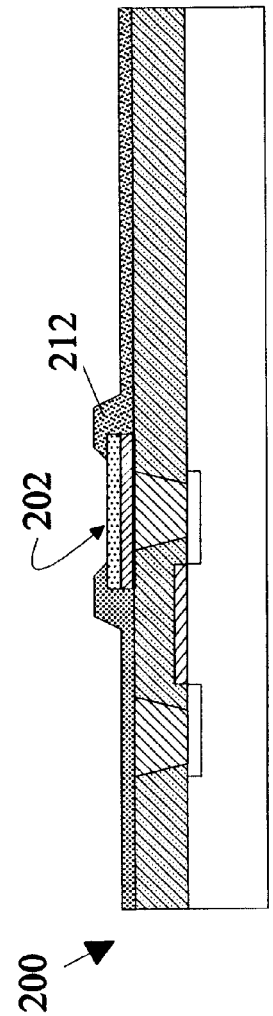

Refer now to FIG. 3. After the above described layers are deposited, the ohmic contact and platinum layers are etched to form the lower electrode of the capacitor 202. This etching operation is preferably carried out as an ECR Chlorine plasma RIE. A barrier layer 212 of approximately 600 Å is then deposited over the surface of the chip and a window opened over electrode 202 as shown in FIG. 4. The preferred barrier layer is $TiO_2$ which is etched using a $CCl_4$ plasma. The barrier layer is needed to prevent interaction between the ferroelectric layer and the $SiO_2$ around the platinum contact.

The ferroelectric layer 213 (approximately 1200 Å) and the upper electrode comprising ohmic layer 214 (approximately 600 Å) and platinum layer 215 (approximately 1000 Å) are then deposited as shown in FIG. 5. These layers are then stack etched using an ECR Chlorine plasma RIE to provide the capacitor structure shown in FIG. 6 at 216. It should be noted that the stack etch is timed to stop after removing the barrier layer in those regions that do not underlie top electrode 215. The stack etch extends into a portion of the $SiO_2$ layer 207. The end point of the etch may be detected by observing the material removed during the etch, the end point being that point at which Ti is no longer present in the removed material.

Refer now to FIG. 7. After stack etching the top electrode structure and ferroelectric dielectric layer, a layer 221 (approximately 400 Å) of dielectric material, preferably $TiO_2$, is deposited on the chip. This layer is then covered with a layer 218 (approximately 2000 Å) of $SiO_2$ and vias opened to the polysilicon contact 209. The via is etched in two steps. First, a $CF_4$ plasma etch is used to remove the $SiO_2$. Then a $CCl_4$ etch is used to remove the $TiO_2$. A polysilicon extension 219 of contact 209 is then grown and the aluminum bit lines 220 deposited.

Figure 8:
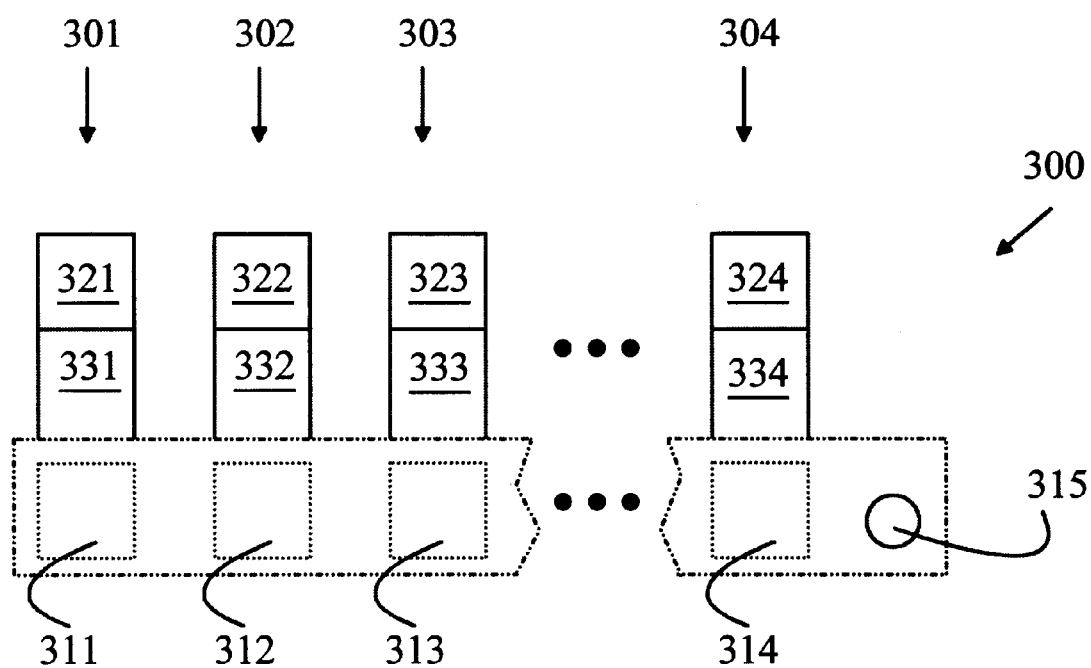
FIG. 8 is a top view of one word of a high density memory according to the present invention.

Refer now to FIG. 8 which is a top view of one word 300 of a high density memory according to the present invention. Exemplary one bit memory cells are shown at 301–304. The sources of the CMOS transistors corresponding to memory cells 301–304 are shown at 321–324, respectively. Similarly, the gates of the CMOS transistors corresponding to memory cells 301–304 are shown at 331–344, respectively. The bottom electrodes of the capacitors over the drains of the CMOS transistors corresponding to memory cells 301–304 are shown in phantom at 311–314, respectively. It should be noted that the top electrode 316 and ferroelectric layer of the capacitors in a given word of the memory are connected together. Hence, the top electrodes are continuous over all of the bits of a word. A single via 315 is opened to the top plates and connected to the plate line shown in FIG. 1. Each single bit memory cell has its source connected to a bit line. The bit lines run perpendicular to top electrode 316. To simplify the drawing, the bit lines have been omitted. The connections to the gates of the CMOS transistors depend on the particular memory architecture, and hence, have been omitted from the drawing to simplify the drawing.

The continuous top electrode and dielectric layer provide two advantages compared to embodiments in which the individual capacitors have separated dielectric layers and top electrodes. First, when separated layers are used, the top electrodes must be connected by metalization and the steps between the capacitors complicate this deposition. Second, the metalization layer is found experimentally to alter the capacitances of the capacitors in an unpredictable manner.

The preferred inter layer dielectric material for layer 221 is $TiO_2$ because it has been found experimentally that this layer forms an oxygen impervious seal that inhibits changes in the number of oxygen vacancies in the dielectric layer 213 of the capacitor during the forming gas anneal. In effect, inter layer dielectric 221 prevents oxygen from escaping from the capacitor dielectric during the forming gas anneal.

The preferred dielectric for the capacitor is lead zirconium titanate that has been doped with a material that has an oxidization state greater than +4. The dielectric is deposited and annealed to form a perovskite structure. The simple perovskite structure is a cubic unit cell. A large cation (A) occupies the corners of the cube, a smaller cation (B) occupies the body center position, and oxygen ions occupy the center of the faces of the unit cell. A generalized chemical formula for this structure is conventionally represented by $ABO_3$. For PZT materials, the A-site is typically occupied by lead, and the B-site is typically occupied by zirconium or titanium. Capacitors with PZT as the dielectric will be referred to as PZT capacitors.

As noted above, conventional PZT capacitors suffer from imprint effects. The degree of imprint may be quantified by measuring the shift in the coercive voltage as a function of time after the capacitor is programmed in one direction of polarization. In general, the coercive voltage shift increases slowly with time. However, it has been found experimentally that the rate of shift can be increased by elevating the temperature of the capacitor. This procedure allows the degree of imprint inherent in any given capacitor design to be estimated without the need to wait for a time period that would be months to years in the absence of the temperature stress. In general, the capacitor to be tested is polarized and then subsequently held at a temperature that is less than the Curie point of the dielectric material. For example, a capacitor having Pt electrodes and a PZT composition of 30/70 exhibits a 2.05 V shift in coercive voltage after being held at 140° C. for 45 minutes in the absence of an externally applied voltage. This represents a 64% shift in the observed coercive voltage which was 3.2 V for the capacitor in question.

The present invention is based, in part, on the experimental observation that the inclusion of a dopant element that occupies a portion of the B-sites and has an oxidation state greater than +4 reduces the imprint observed in the capacitors. The voltage shift for a number of B-site dopants has been measured using the temperature accelerated shifting procedure described above. For dopants that have an oxidation state greater than +4, substantial reductions in the shift in coercive voltage are observed. For example, the addition of 4% Nb reduces the percentage shift in coercive voltage to 18% from the 64% value obtained in the absence of the dopant. Similarly, including 4% Ta reduced the shift to less than 10%, and 2% W reduces the shift to 34%. All of these dopants have oxidation states greater than +4.

The optimum level of dopant depends on a number of factors. While the inclusion of the dopant improves imprint, the dopants, in general, decrease the remanent polarization of dielectric. This reduces the amount of charge that is available for detection when the capacitor's state is reversed. Since there is a minimum charge needed to detect the initial state of the capacitor, this effect places an upper limit on the amount of dopant that may be used.

In addition, the addition of these dopants lowers the Curie point of the dielectric material. If the Curie point is too close to the operating temperature of the capacitor, the remanent polarization will be decreased at an unacceptable rate with time, thereby causing retention problems.

In practice, it has been found that the preferred doping concentrations are those that result in 1% to 8% of the B-sites being filled by the dopant. At concentrations below 1%, there is insufficient improvement in imprint. At higher dopant concentrations, the problems discussed above limit the performance of the capacitors. However, it will be apparent to those skilled in the art that other dopant levels may be advantageous in situations in which the operating temperature or other parameters discussed above allow higher dopant levels to be advantageously utilized.

As noted above, prior art PZT capacitors also suffer from fatigue. If single crystal electrode structures are utilized for the ohmic material, fatigue is absent or negligible. Unfortunately, single crystal electrode structures constructed from an ohmic material are difficult to construct in a commercially viable fabrication process. It has been known in the prior art that the inclusion of an ohmic contact material such as polycrystalline $RuO_2$ reduces fatigue. However, the degree of reduction obtained with $RuO_2$ is insufficient to provide commercially viable memories.

The present invention is based on the experimental observation that polycrystalline LSCO on PNZT (PZT doped with Niobium at 4%) has both low imprint and fatigue. While ohmic materials are expected to improve fatigue, such materials are not predicted to improve imprint. However, it has been found experimentally that Pt:LSCO electrodes have lower imprint than Pt electrodes or Pt:$RuO_2$ electrodes. For example, the percentage shift in the coercive voltage obtained with Pt:LSCO electrodes is approximately half of that obtained with Pt:$RuO_2$. In addition, the Pt:LSCO electrode configuration shows no fatigue at cycle times at which either Pt:$RuO_2$ or Pt electrodes with no ohmic contact material have fatigued to the point of being useless.

An added benefit of the Nb doping is a decrease in the Curie point of the ferroelectric layer. PZT (20/80) doped with 4% Nb has a Curie point below 400° C., but well above the desired operating temperature of the memory cells. Non-doped PZT has a Curie point of about 450° C. When the memory cells are completed, they must be processed in a forming gas anneal step in which the temperature must be kept below 400° C. to prevent damage to the aluminum conductors on the chip. If the capacitors are subjected to high temperatures below the Curie point of the ferroelectric, electrons and holes can be elevated into the conduction bands and move under the influence of the electric field in the domains. These charges become trapped in a non-uniform pattern that aggravates the imprint problem discussed above. The forming gas anneal required in conventional semiconductor manufacturing causes this type of damage. In addition, any fabrication steps that subject the ferroelectric layer to elevated temperatures below the Curie point of the ferroelectric likewise cause this type of damage.

The damage in question may be reversed by re-annealing the ferroelectric at a temperature above its Curie point. At such temperatures, the domains disappear and the charges are then distributed in a random manner. Since the Nb doped PZT has a Curie point below the temperature of the forming gas anneal, the forming gas anneal provides the final annealing of the ferroelectric, and hence, any such damage is repaired by the forming gas anneal.

Finally, it should be noted that the present invention provides a memory system which can be fabricated with conventional semiconductor processing equipment using polycrystalline materials for the capacitors. Capacitors constructed with single crystal electrodes and dielectrics are known to have substantially less imprint and fatigue problems; however, the lack of an economical commercially viable fabrication system for constructing such capacitors has prevented memories based on such single crystal structures from being commercially viable. The combination of doped PZT and LSCO electrodes utilized in the present invention provides acceptable imprint and fatigue even though the electrode and dielectric structures are polycrystalline.

Various modifications to the present invention will become apparent to those skilled in the art from the foregoing description and accompanying drawings. Accordingly, the present invention is to be limited solely by the scope of the following claims.

What is claimed is:

1. A method for constructing a memory cell comprising the steps of:

fabricating an isolation transistor having a source, drain, and gate on a silicon substrate;

depositing a first dielectric layer on said substrate;

opening vias to said source and drain;

growing polysilicon contacts in said vias, said polysilicon contacts making contact with said source and drain, respectively;

depositing a first platinum layer, said platinum layer making electrical contact with said polysilicon contact connected to said drain;

depositing a first layer of ohmic material on said platinum layer;

etching said first platinum and ohmic layers to form a bottom electrode of said capacitor;

depositing a barrier layer over said substrate;

depositing a layer of capacitor dielectric material over said barrier layer, said dielectric material comprising lead zirconium titanate doped with an element having an oxidation state greater than +4;

depositing a second layer of ohmic material on said layer of capacitor dielectric material;

depositing a second layer of platinum on said second layer of ohmic material;

stack etching said layer of capacitor dielectric material and said second layers of ohmic material and platinum to form the top electrode and dielectric layer of said capacitor.

2. The method of claim 1 further comprising the steps of:

covering said substrate with a layer of inter layer dielectric material;

opening a via in said inter layer dielectric layer, said via connecting said source with the top surface of said inter layer dielectric layer;

growing a polysilicon contact in said via; and depositing a metal line connecting said polysilicon contact to a bit line of a memory.

3. The method of claim 1 wherein said ohmic material is chosen from the group consisting of LSCO and $RuO_2$.

* * * * *